United States Patent
Tsutsumi et al.

(10) Patent No.: US 6,975,185 B2
(45) Date of Patent: Dec. 13, 2005

(54) SURFACE ACOUSTIC WAVE FILTER AND SURFACE ACOUSTIC WAVE DUPLEXER HAVING THE SAME

(75) Inventors: Jun Tsutsumi, Kawasaki (JP); Shogo Inoue, Kawasaki (JP); Takashi Matsuda, Kawasaki (JP); Masanori Ueda, Yokohama (JP)

(73) Assignees: Fujitsu Media Devices Ltd., Yokohama (JP); Fujitsu Limited, Kawasaki (JP)

( * ) Notice: Subject to any disclaimer, the term of this patent is extended or adjusted under 35 U.S.C. 154(b) by 26 days.

(21) Appl. No.: 10/671,783

(22) Filed: Sep. 29, 2003

(65) Prior Publication Data
US 2004/0095206 A1 May 20, 2004

(30) Foreign Application Priority Data
Sep. 30, 2002 (JP) ........................................ 2002-284867

(51) Int. Cl.[7] .................................................. H03H 9/64
(52) U.S. Cl. ......................................... 333/193; 333/195
(58) Field of Search ................................ 333/193, 194, 333/195, 196; 310/313 B

(56) References Cited

U.S. PATENT DOCUMENTS

| | | | | | |
|---|---|---|---|---|---|
| 5,313,177 | A | * | 5/1994 | Hickernell et al. | 333/193 |
| 6,031,435 | A | * | 2/2000 | Inose et al. | 333/193 |
| 6,201,457 | B1 | * | 3/2001 | Hickernell | 333/193 |
| 6,777,855 | B2 | * | 8/2004 | Bergmann et al. | 310/313 B |
| 6,828,878 | B2 | * | 12/2004 | Takamine et al. | 333/193 |

FOREIGN PATENT DOCUMENTS

| | | |
|---|---|---|
| JP | 10-303698 | 11/1998 |
| JP | 2000-114923 | 4/2000 |

* cited by examiner

*Primary Examiner*—Dean Takaoka
(74) *Attorney, Agent, or Firm*—Arent Fox, PLLC.

(57) ABSTRACT

A surface acoustic wave filter includes a series-arm resonators and parallel-arm resonators that are connected in a ladder-like structure, each having an interdigital transducer formed on a piezoelectric substrate, and at least one of the series-arm resonators having a different static capacitance from the other series-arm resonators. In this surface acoustic wave filter, at least one of the series-arm resonators except the series-arm resonator located at the first stage in the ladder-like structure has a lower average resonant frequency than the other series-arm resonators.

24 Claims, 13 Drawing Sheets

SAW PROPAGATION DIRECTION

SAW PROPAGATION DIRECTION

SURFACE ACOUSTIC WAVE FILTER AND SURFACE ACOUSTIC WAVE DUPLEXER HAVING THE SAME

BACKGROUND OF THE INVENTION

1. Field of the Invention

The present invention generally relates to a surface acoustic wave filter, and more particularly, to a surface acoustic wave filter that is used for high-frequency units of mobile communication devices and is required to have filter characteristics with a high shape factor. The present invention also relates to a surface acoustic wave duplexer (an antenna duplexer) having the surface acoustic wave filter.

2. Description of the Related Art

A mobile communication system today has a transmission band and a reception band very close to each other, so that the limited frequency band area can be efficiently utilized. In the PCS (Personal Communications Service) in North America, for example, the frequency gap between the transmission band and the reception band is only 20 MHz, though the pass band is located in 1.9 GHz.

To avoid crosstalk in such a mobile communication system, the frequency region (the transition region) from the pass band to a stop band needs to be very narrow in an antenna duplexer that separates transmission signals from reception signals.

To produce such antenna duplexers, dielectric filters or film bulk acoustic wave resonators (FBAR) have conventionally been used.

With a dielectric filter, however, the antenna duplexer becomes large in size. With a FBAR, on top of the problem of large size, it is necessary to control the film thickness with high precision, resulting in a poor production yield and high production costs.

In view of the above facts, more and more antenna duplexers are being produced using surface acoustic wave filters, so that smaller and thinner antenna duplexers can be achieved with a high production yield.

In general, however, a surface acoustic wave filter exhibits bandpass characteristics with a poorer shape factor than filter devices including dielectric elements or FBARs. Therefore, in order to produce a small and inexpensive antenna duplexer at a high yield, it is essential to improve the shape factor of the bandpass characteristics of each surface acoustic wave filter.

The shape factor of the bandpass characteristics needs to be improved, also because an antenna duplexer is to be located immediately before an antenna. Accordingly, each antenna duplexer needs to have a smaller loss and higher attenuation characteristics than an interstage filter.

For these reasons, there has been an urgent need to develop a surface acoustic wave filter having bandpass characteristics with an excellent shape factor.

SUMMARY OF THE INVENTION

It is therefore an object of the present invention to provide a surface acoustic wave filter and a surface acoustic wave duplexer having the surface acoustic wave filter in which the above disadvantage is eliminated.

A more specific object of the present invention is to provide a surface acoustic wave filter that exhibits bandpass characteristics with an improved shape factor.

Another specific object of the present invention is to provide a small-size, inexpensive surface acoustic wave duplexer using the above surface acoustic wave filter.

The above objects of the present invention are achieved by a surface acoustic wave filter comprising series-arm resonators and parallel-arm resonators that are connected in a ladder-like structure, each having an interdigital transducer formed on a piezoelectric substrate, and at least one of the series-arm resonators having a different static capacitance from the other series-arm resonators, wherein at least one of the series-arm resonators except the series-arm resonator located at the first stage in the ladder-like structure has a lower average resonant frequency than the other series-arm resonators.

The above objects of the present invention are also achieved by a surface acoustic wave filter comprising series-arm resonators and parallel-arm resonators that are connected in a ladder-like structure, each having an interdigital transducer formed on a piezoelectric substrate, and at least one of the series-arm resonators having a different static capacitance from the other series-arm resonators, wherein at least one of the series-arm resonators except the series-arm resonator located at the first stage in the ladder-like structure has an interdigital transducer with a longer electrode finger pitch than the average of electrode finger pitches of the interdigital transducers of the other series-arm resonators.

The above objects of the present invention are also achieved by a surface acoustic wave filter comprising series-arm resonators and parallel-arm resonators that are connected in a ladder-like structure, each having an interdigital transducer formed on a piezoelectric substrate, and the series-arm resonator located at the last stage having a smaller static capacitance than the other series-arm resonators, wherein at least one of the series-arm resonators except the series-arm resonator located at the first stage in the ladder-like structure has an interdigital transducer with a longer electrode finger pitch than the average of electrode finger pitches of the interdigital transducers of the other series-arm resonators.

The above objects of the present invention are also achieved by a surface acoustic wave duplexer comprising two filters having different pass bands, one of the two filters located on a lower frequency side comprising a surface acoustic wave filter that includes series-arm resonators and parallel-arm resonators that are connected in a ladder-like structure, each having an interdigital transducer formed on a piezoelectric substrate, and at least one of the series-arm resonators having a different static capacitance from the other series-arm resonators, wherein at least one of the series-arm resonators except the series-arm resonator located at the first stage in the ladder-like structure has a lower average resonant frequency than the other series-arm resonators.

The above objects of the present invention are also achieved by a surface acoustic wave duplexer comprising two filters having different pass bands, one of the two filters located on a lower frequency side comprising a surface acoustic wave filter that includes series-arm resonators and parallel-arm resonators that are connected in a ladder-like structure, each having an interdigital transducer formed on a piezoelectric substrate, and at least one of the series-arm resonators having a different static capacitance from the other series-arm resonators, wherein at least one of the series-arm resonators except the series-arm resonator located at the first stage in the ladder-like structure has an interdigital transducer with a longer electrode finger pitch than the average of electrode finger pitches of the interdigital transducers of the other series-arm resonators.

The above objects of the present invention are also achieved by a surface acoustic wave duplexer comprising two filters having different pass bands, one of the two-filters located on a lower frequency side comprising a surface acoustic wave filter that includes series-arm resonators and parallel-arm resonators that are connected in a ladder-like structure, each having an interdigital transducer formed on a piezoelectric substrate, and the series-arm resonator located at the last stage having a smaller static capacitance than the other series-arm resonators, wherein at least one of the series-arm resonators except the series-arm resonator located at the first stage in the ladder-like structure has an interdigital transducer with a longer electrode finger pitch than the average of electrode finger pitches of the interdigital transducers of the other series-arm resonators.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

First, a "shape factor" needs to be defined.

The present invention is to improve the shape factor especially in the region between the pass band and the stop band on the high-frequency side. In the present invention, the shape factor is defined as equal to the frequency difference $\Delta f$ between the point of −3 dB on the high-frequency side in the pass band and the point of −40 dB. Accordingly, as the frequency difference $\Delta f$ decreases, the change or slope from the pass band to the stop band becomes steeper. The smaller frequency difference $\Delta f$, the better shape factor. The frequency difference $\Delta f$ is also referred to as the transition region.

The following is a description of preferred embodiments of the present invention, with reference to the accompanying drawings.

(First Embodiment)

Figure 1:
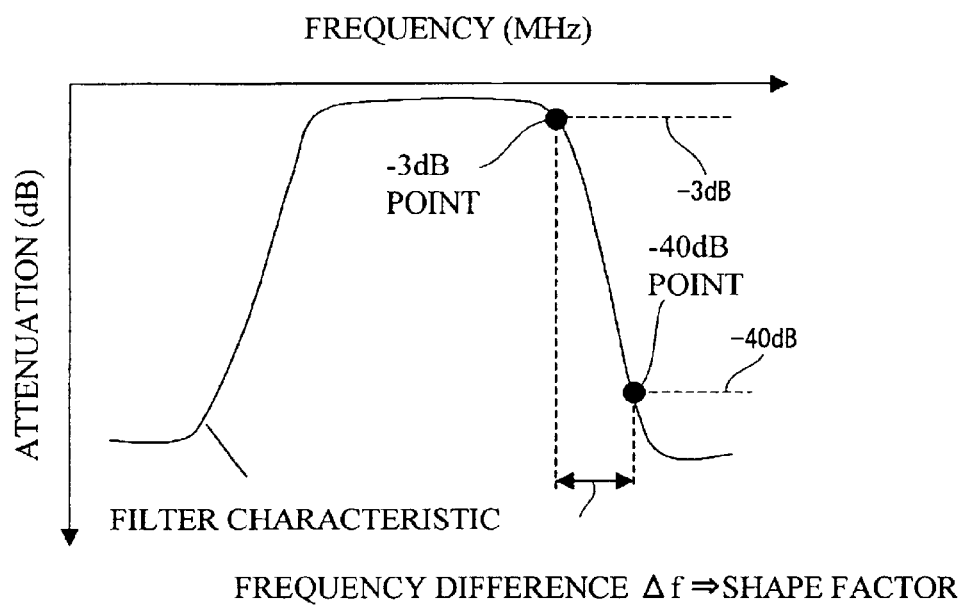
FIG. 1 is a graph showing what a "shape factor" is.
Figure 2:
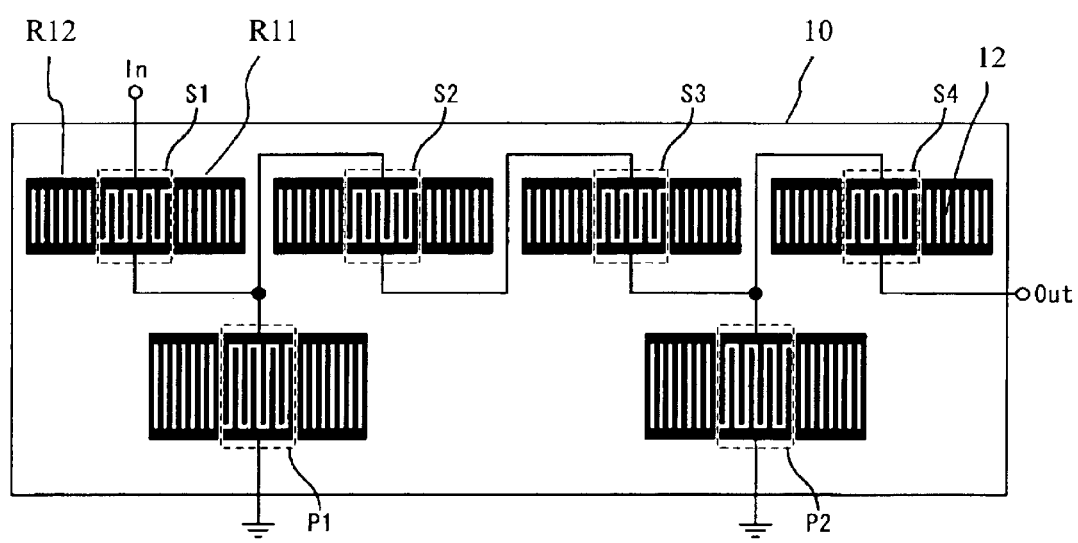
FIG. 2 is a top view of a ladder-type SAW filter device in accordance with a first embodiment of the present invention.

FIG. 2 is a top view of a ladder-type surface acoustic wave (SAW) filter device 1 in accordance with a first embodiment of the present invention. As shown in FIG. 2, the ladder-type SAW filter device 1 includes four series-arm resonators S1 through S4 arranged in series arms and two parallel-arm resonators P1 and P2 arranged in parallel arms in a ladder structure.

Figure 3:
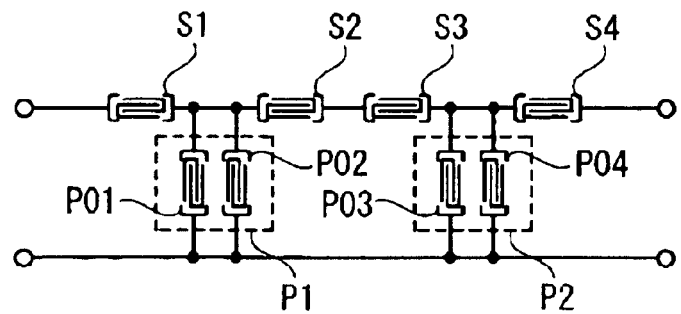
FIG. 3 is a circuit diagram of the ladder-type SAW filter device of FIG. 2.
Figure 4:
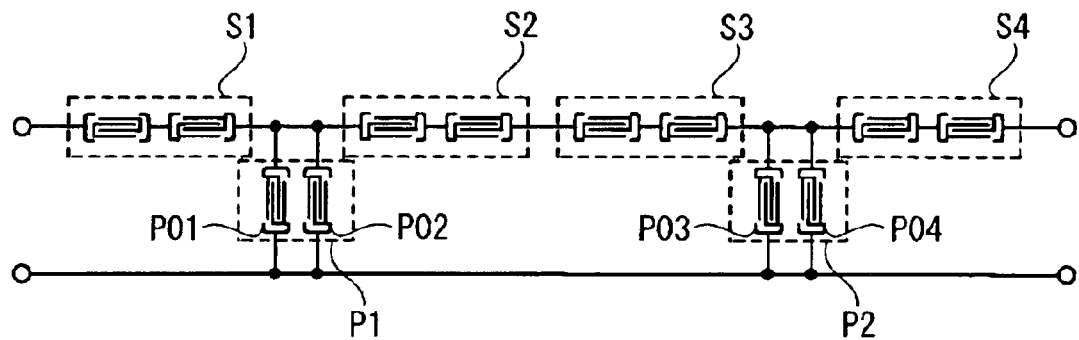
FIG. 4 is another circuit diagram of the ladder-type SAW filter device of FIG. 2.

Here, the series-arm resonators of a ladder-type SAW filter will be explained. The ladder-type SAW filter device 1 shown in FIG. 2 has a four-stage structure starting from the series-arm resonator S, and its circuit structure can be represented as S-P-P-S-S-P-P-S, with each series-arm resonator being S, and each parallel-arm resonator being P. A circuit diagram of this structure is shown in FIG. 3. The ladder-type SAW filter device 1 shown in FIG. 2 has each two neighboring parallel-arm resonators (P01 and P02/P03 and P04) combined into one parallel-arm resonator P1/P2. This ladder-type SAW filter device 1 having a four-stage structure includes four series-arm resonators that are referred to as S1, S2, S3, and S4, in this order when seen from the input side, as shown in FIG. 2. In an antenna duplexer filter, however, each series-arm resonator might be divided into two, so as to increase its power durability. FIG. 4 illustrates a structure that can be obtained when each series-arm resonator is divided into two in the ladder-type SAW filter device of FIG. 2. In this structure, each two neighboring series-arm resonators are regarded as one set, and the four sets of series-arm resonators are referred to as S1 through S4, as shown in FIG. 4. The electrode finger pitches of each set of series-arm resonators are determined by the average value of the electrode finger pitches of the two series-arm resonators. The same applies to cases where each series-arm resonator is divided into three or more.

In the ladder-type surface acoustic wave filter device 1 of this embodiment, the series-arm resonators S1 through S4 and the parallel-arm resonators P1 and P2 each has an interdigital transducer (ITD) 11 of a single-electrode structure on a piezoelectric substrate 10. Also, reflectors R11 and R12 each having a lattice-like reflector electrode 12 are provided before and behind the IDT 11 in the propagation direction of surface acoustic wave (SAW). The reflectors R11 and R12 serve to shut the surface acoustic wave more securely in the resonators S1, P1, and P2. Accordingly, the shape factor of the bandpass characteristics of the ladder-type SAW filter can be greatly increased by the reflectors R11 and R12.

The piezoelectric substrate 10 may be a 42° Y-cut X-propagation LiTaO$_3$ substrate, for example.

If the static capacitances of the series-arm resonators S1 through S4 are not uniform in the ladder-type SAW filter device 1, the shape factor is not necessarily optimized when the electrode finger pitches of all the series-arm resonators S1 through S4 are made uniform. However, the shape factor can be improved in such a case by changing the electrode finger pitches of at least one series-arm resonator (S3, for example). If the static capacitances, the widths of the electrode finger crossing parts, and the number of electrode finger pairs are made substantially uniform among all the series-arm resonators S1 through S4, the shape factor on the high-frequency side can be optimized by making uniform the electrode finger pitches of the interdigital transducers of all the series-arm resonators S1 through S4.

This can be explained in terms of the admittance characteristics of the series-arm resonators S and the parallel-arm resonators P. In the following description, any one series-arm resonator will be denoted by S, and any one parallel-arm resonator will be denoted by P.

Figure 5:
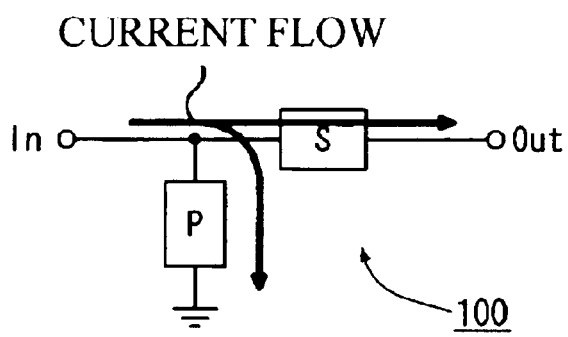
FIG. 5 is a schematic view of a ladder filter having one-stage structure.

FIG. 5 illustrates the relationship between the admittance characteristics of a series-arm resonator S and a parallel-arm resonator P and the filter characteristics of a ladder-type SAW filter 100 (hereinafter referred to simply as the "ladder filter 100") that has a one-stage structure including the series-arm resonator S and the parallel-arm resonator P. As shown in FIG. 5, the ladder filter 100 having a one-stage structure has one series-arm resonator S and one parallel-arm resonator P. In FIG. 5, the direction of the arrow indicates the direction of the flow of current in the ladder filter 100.

Figure 6:
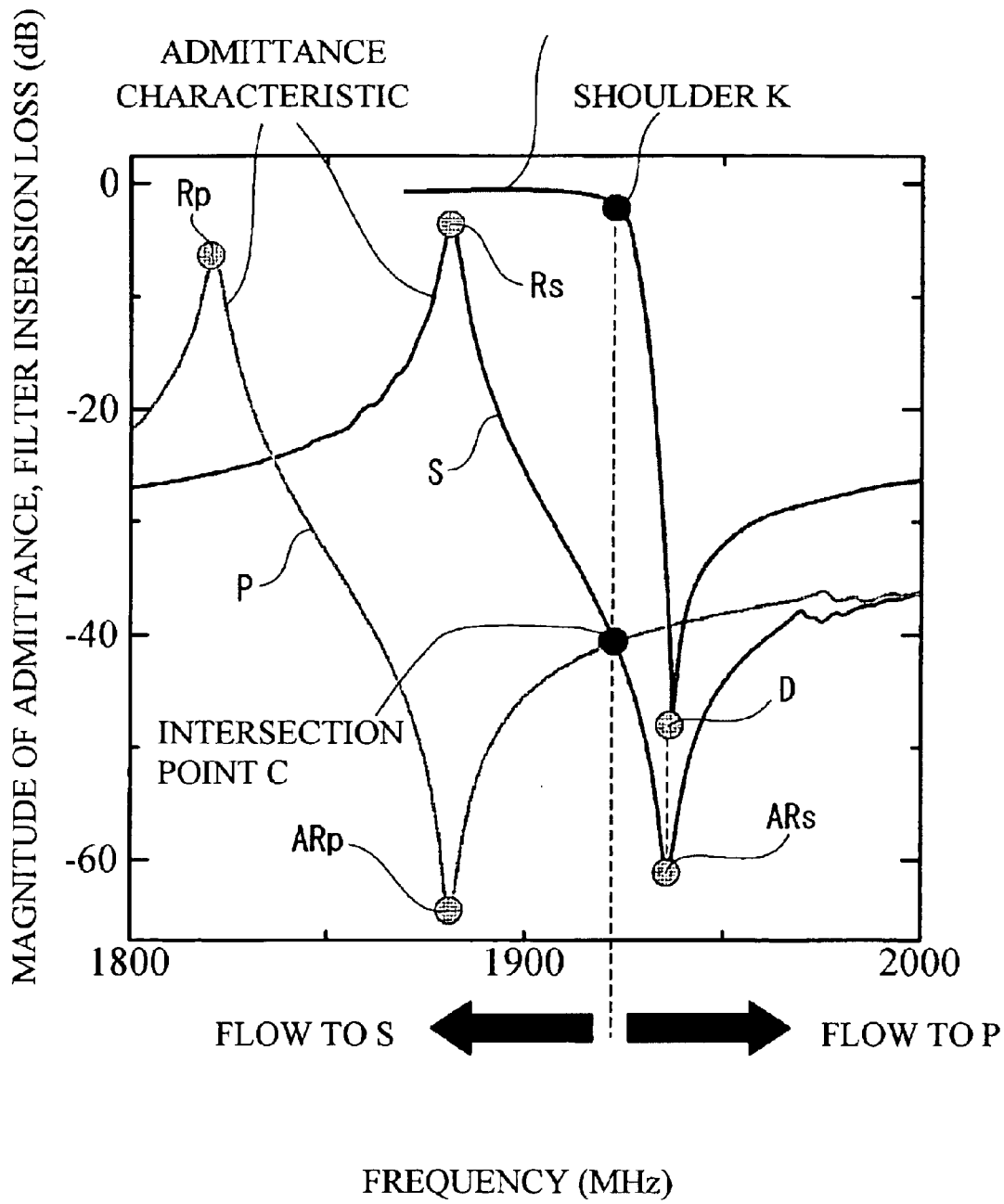
FIG. 6 is a graph showing the admittance characteristics and the filter characteristics of the ladder filter of FIG. 5.

FIG. 6 shows the admittance characteristics (also referred to as the magnitude of admittance and the filter characteristics (also referred to as the filter insertion loss) of the ladder filter 100 shown in FIG. 5. As can be seen from FIG. 6, the frequency at the intersection point C of the curve representing the admittance characteristics of the series-arm resonator S and the curve representing the admittance characteristics of the parallel-arm resonator P is the same as the frequency at the "shoulder" point K in the filter characteristics of the ladder filter 100. This is because the magnitude of admittance of the series-arm resonator S is greater than that of the parallel-arm resonator P at any frequency lower than the frequency at the intersection point C. When the magnitude of admittance of the series-arm resonator S is greater than that of the parallel-arm resonator P, most of the current flows toward the series-arm resonator S. At any frequency higher than the frequency at the intersection point C, on the other hand, the admittance absolute value of the parallel-arm resonator P is greater than that of the series-arm resonator S. In such a case, most of the current flows toward the parallel-arm resonator P. As a result, the region of higher frequencies than the intersection point C becomes a stop band, and the filter insertion loss increases accordingly. At the intersection point C (or the "shoulder" point K in the filter characteristics), the current flowing into the series-arm resonator S is equal to the current flowing into the parallel-arm resonator P, and the insertion loss is approximately −3 dB.

The frequency at the attenuation pole D of the filter characteristics is also the same as the frequency at the anti-resonant point ARs of the series-arm resonator S. Accordingly, the shape factor (the transition region) of the filter characteristics are determined by the frequency difference Δf between the anti-resonant point ARs of the series-arm resonator S and the intersection point C of the admittance characteristics of the series-arm resonator S and the parallel-arm resonator P.

Next, the filter characteristics and the admittance characteristics of a ladder filter of a multi-stage structure (hereinafter referred to as the "ladder filter 200") will be described. If the static capacitances of the series-arm resonators S are uniform in the ladder filter 200 of a normal multi-stage structure, the admittances of all the series-arm resonators S are the same. Therefore, the admittance characteristics (the magnitude of admittance) of each series-arm resonator S and each parallel-arm resonator P become equivalent to the curves shown in FIG. 6.

Figure 7:
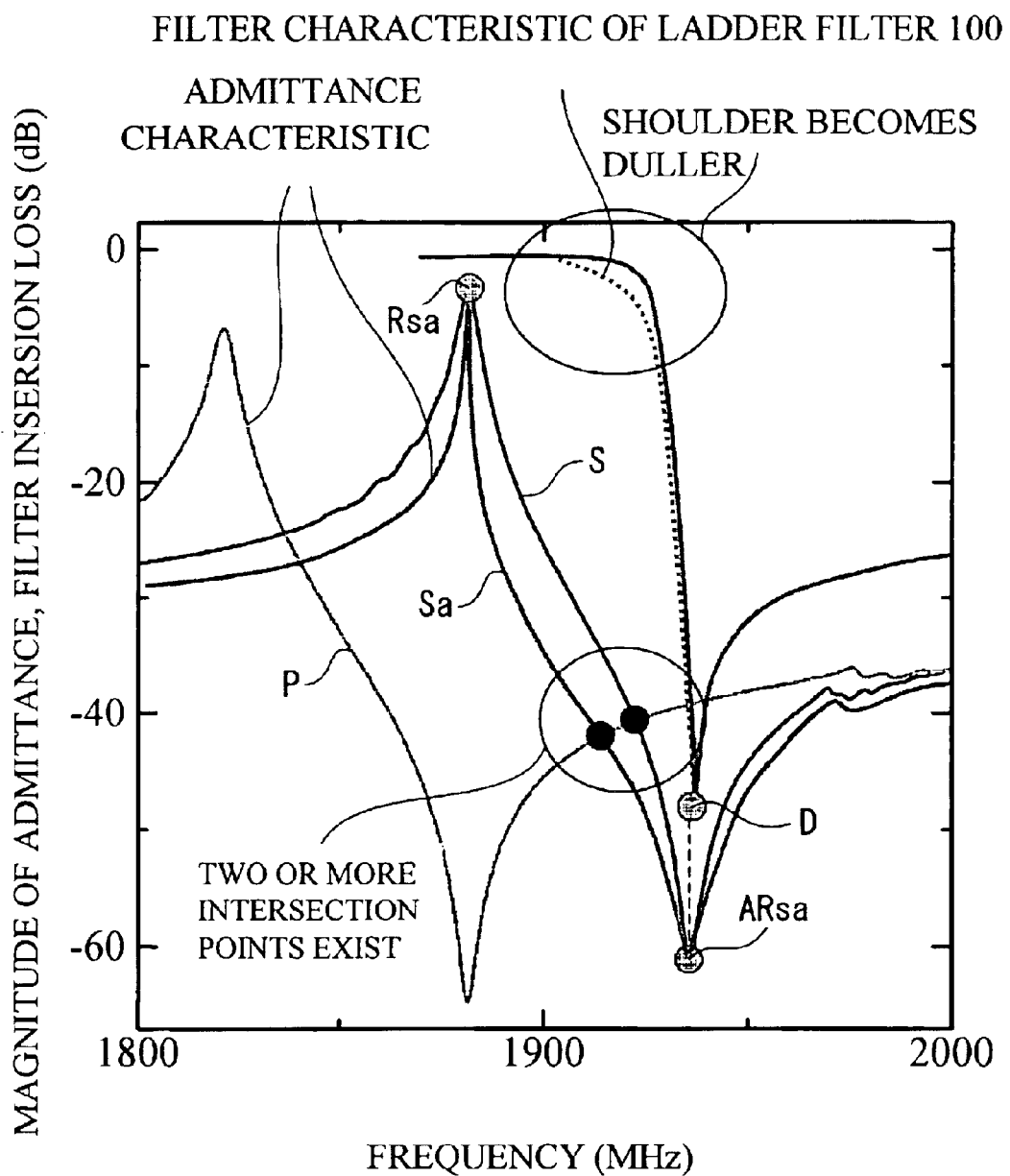
FIG. 7 is a graph showing the admittance characteristics and the filter characteristics of another ladder filter in accordance with the first embodiment.

However, if one or more of the series-arm resonators S have a different static capacitance from the others in the ladder filter 200 of the multi-stage structure (the resonator with the different static capacitance being Sa), the admittance characteristics of the series-arm resonator Sa become equivalent to the admittance characteristics curve shown in FIG. 7. More specifically, the frequencies at the resonant point Rsa and the anti-resonant point ARsa of the series-arm resonator Sa (the frequencies being the resonant frequency and the anti-resonant frequency) are the same as those of a ladder filter with uniform static capacitances, but admittance characteristics of the series-arm resonators S and Sa and the parallel-arm resonators P have two or more intersection points. This causes two or more "shoulder" points K in the filter characteristics, and the "shoulder" of the curve of the filter characteristics becomes duller. As a result, the shape factor deteriorates (see the dotted line in FIG. 7).

Figure 8:
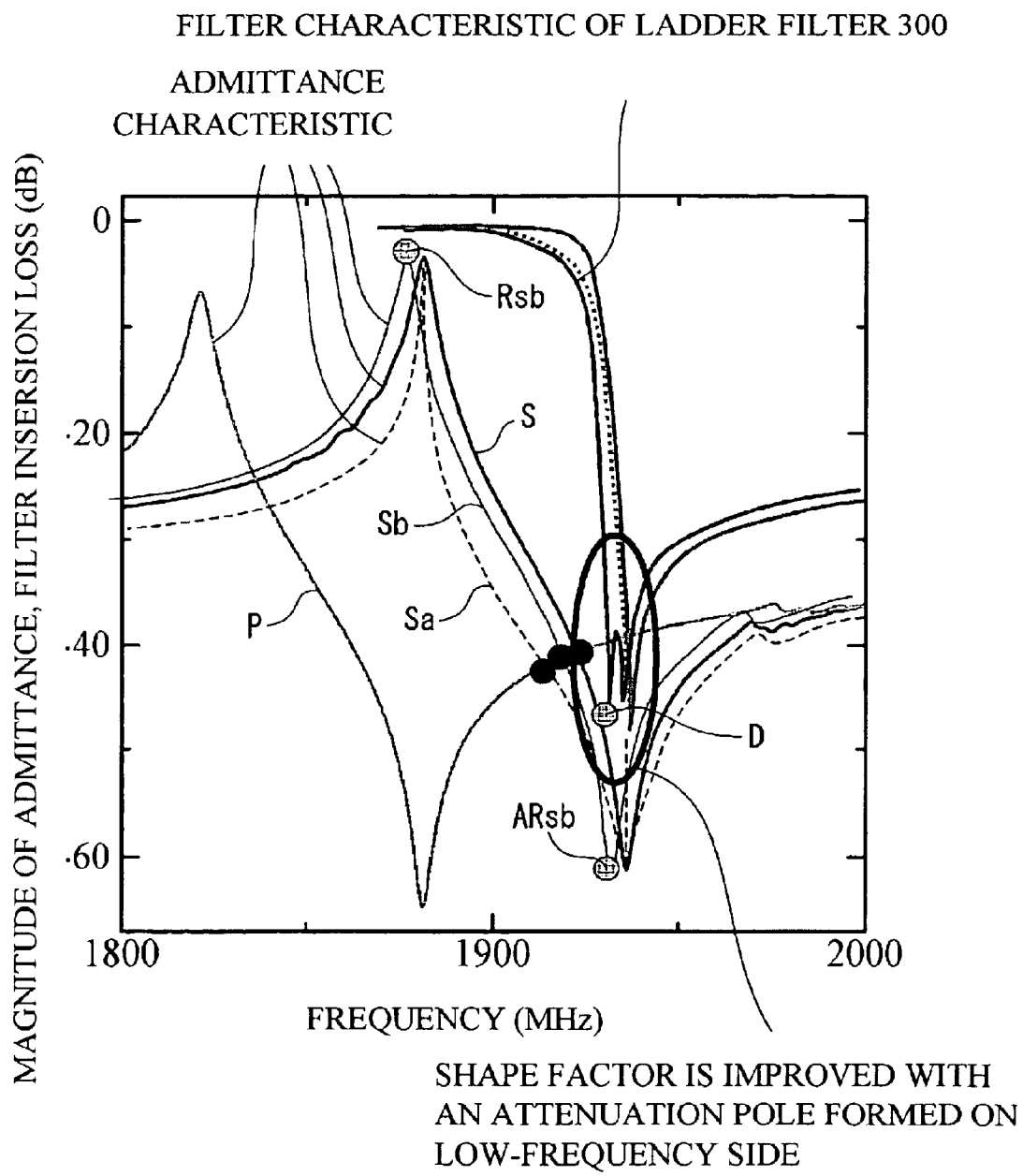
FIG. 8 is a graph showing the admittance characteristics and the filter characteristics of yet another ladder filter in accordance with the first embodiment.

To solve this problem, the resonant frequency of at least one series-arm resonator (this series-arm resonator being Sb) is set slightly lower than the resonant frequencies of the other series-arm resonators S in this embodiment. In other words, each electrode finger pitch of the series-arm resonator Sb is set slightly longer than each electrode finger pitch of the other series-arm resonators S. A ladder filter having such a structure will be hereinafter referred to as the ladder filter 300. With the resonant frequency of the series-arm resonator Sb being set lower, the anti-resonant frequency of the series-arm resonator Sb becomes also lower. Accordingly, the attenuation pole D of the filter characteristics corresponding to the anti-resonant frequency appears at a lower frequency point, and the shape factor is improved, as shown in FIG. 8. Also, another intersection point appears in the admittance characteristics of the series-arm resonator Sb and the parallel-arm resonator P in this structure. Still, the shape factor is improved, because the effect of the attenuation pole D shifting to the lower frequency side is greater than the effect of the "shoulder" point K of the filter characteristics becoming duller.

As described above, in a case where not all the static capacitances of the series-arm resonators S are the same, the shape factor can be improved by lowering the resonant frequency (or by elongating each electrode finger pitch) of at least one of the series-arm resonators.

Also, in a case where the static capacitance of the last-stage series-arm resonator in the multi-stage structure (the last-stage series-arm resonator being the resonator Sn) is reduced to approximate the impedance in the pass band of a high-frequency filter (a reception filter, for example) to infinity, the shape factor can be improved by lowering the resonant frequency (or by elongating each electrode finger pitch) of at least one series-arm resonator Sb with the same effect as described above. A structure having the last-stage series-arm resonator Sn with a reduced static capacitance is often employed for the low-frequency filters (transmission filters, for example) of antenna duplexers having surface acoustic wave filters.

Next, a process of changing the resonant frequency (or the electrode finger pitches) of one of the series-arm resonator Sb in the ladder filter 300 having a multi-stage structure will be described below. In this embodiment, if the ladder filter 300 has n stages, the resonant frequencies (or the electrode finger pitches) of the series-arm resonators of the second stage to the last stage (these series-arm resonators being denoted by S2 through Sn) are changed, while the resonant frequency (or the electrode finger pitches) of the series-arm resonator of the first stage is not changed (this series-arm resonator being S1). This is because a high power durability is required, as well as a high shape factor, to obtain an antenna duplexer. The power durability of the ladder filter 300 is determined mainly by the power durability of the series-arm resonator S1, which is located closest to the power input. If the electrode finger pitches of the series-arm resonator S1 are changed, the power consumption of the series-arm resonator S1 greatly changes. As a result, the power durability of the antenna duplexer might deteriorate. In a case where the resonant frequencies (or the electrode finger pitches) of the series-arm resonators S2 through Sn of the second to last stages are changed, on the other hand, the power consumptions of the series-arm resonators S2 through Sn do change, but the power durability does not deteriorate to a great degree. This is because the series-arm resonators S2 through Sn are located at a distance from the power input. Therefore, the electrode finger pitches of one of the series-arm resonators S2 through Sn of the second to last stages with relatively small power consumptions are changed in this embodiment, so that deterioration of the power durability can be prevented, and the shape factor can be increased.

Figure 9:
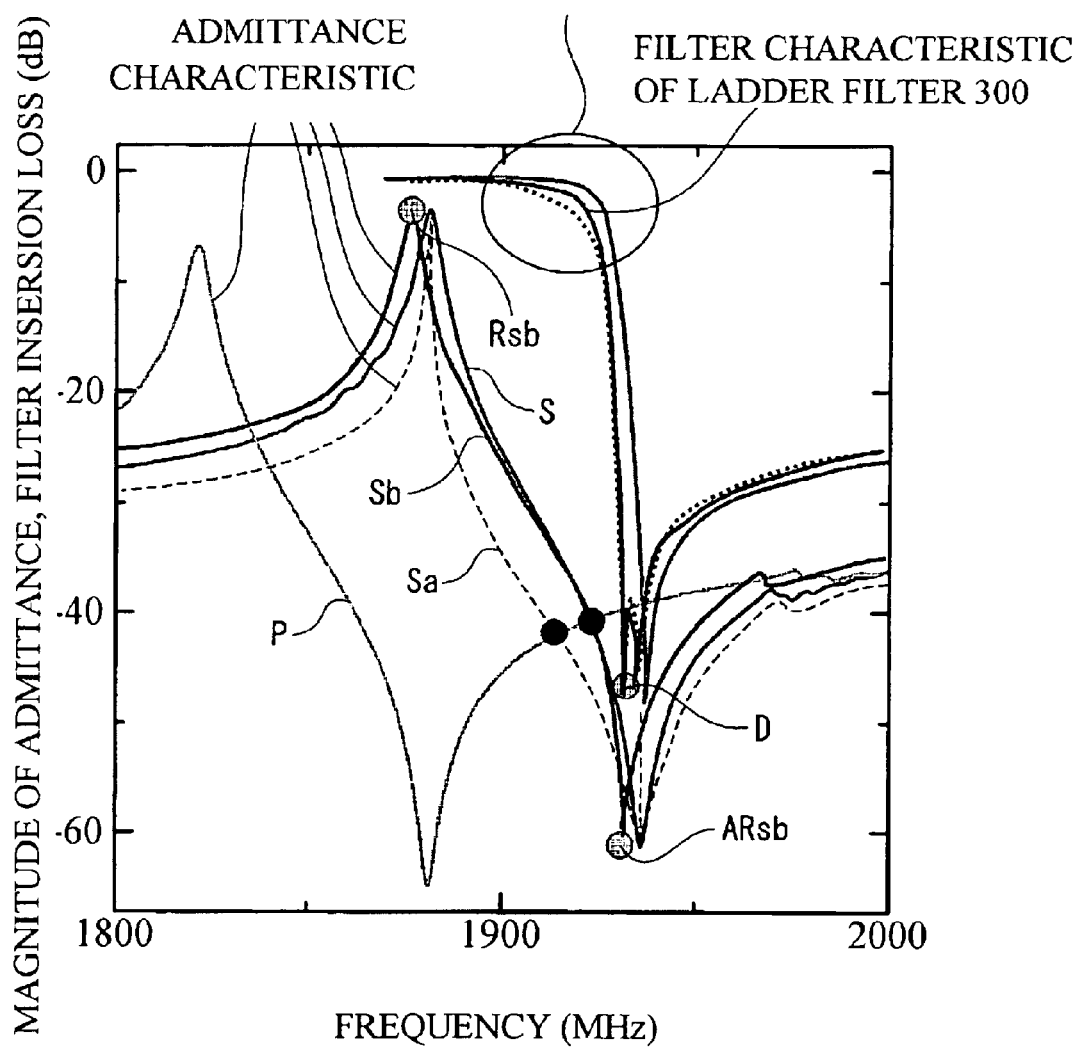
FIG. 9 is a graph showing the admittance characteristics and the filter characteristics of the ladder filter of FIG. 8 that has the static capacitance of the series-arm resonator Sb increased.

In this embodiment, the shape factor of the filter characteristics can be increased simply by changing the resonant frequency of one of the series-arm resonators Sb, as shown in FIG. 8. However, when the resonant frequency of one of the series-arm resonators Sb is changed, two or more intersection points with the admittance characteristics of the parallel-arm resonators P are formed. Therefore, the static capacitance of the series-arm resonator Sb having its resonant frequency changed is set greater than the average value of the static capacitances of the other series-arm resonators S in this embodiment. FIG. 9 shows the admittance characteristics and the filter characteristic of the series-arm resonators S, Sa, and Sb, and the parallel-arm resonators P in a case where the static capacitance of the series-arm resonator Sb having its resonant frequency changed is set greater than the average value of the static capacitances of the other series-arm resonators S. As is apparent from FIG. 9, the resonant frequency and the anti-resonant frequency of the series-arm resonator Sb remain the same after its static capacitance is increased, and the intersection points in the admittance characteristics also remain the same as before. In other words, the number of intersection points with the admittance characteristics appears to have decreased. This confirms the fact that the "shoulder" of the curve of the filter characteristics is made sharper, and the shape factor is improved, by increasing the static capacitance of the series-arm resonator Sb that has its resonant frequency changed.

Next, the results of simulations performed on a ladder filter of this embodiment will be described. In these simulations, the ladder-type SAW filter device 1 having a four-stage structure shown in FIG. 2 was used as the simulation model. In the ladder-type SAW filter device 1 shown in FIG. 2, the parallel-arm resonators P1 and P2 corresponding to the two sets of neighboring series-arm resonators (S1 and S2/S3 and S4) each has a set of two parallel-arm resonators (P01 and P02/P03 and P04) connected in parallel (see FIG. 3). Accordingly, the structure shown in FIG. 2 has the two parallel-arm resonators P1 and P2 in appearance. The ladder-type SAW filter device 1 having such a four-stage structure can be readily employed for an antenna duplexer. Table 1 shows the design parameters of the series-arm resonators S1 through S4 and the parallel-arm resonators P1 and P2 of the ladder-type SAW filter device 1. In the design parameters shown in Table. 1, the static capacitance and the electrode finger pitches (the initial values) of the series-arm resonator S1 are used as reference values for the static capacitances and the electrode finger intervals of the other resonators.

TABLE 1

| Design Parameters of ladder-type SAW filter device 1 | | | | | | |
|---|---|---|---|---|---|---|
| | S1 | S2 | S3 | S4 | P1 | P2 |
| static capacitance (static capacitance of S1 being 1) | 1 | 1 | 1 | 0.75 | 0.8 | 0.8 |
| electrode finger pitch (pitch of S1 being 1: initial value) | 1 | 1 | 1 | 1 | 1.02 | 1.02 |

As is apparent from Table 1, the static capacitance of the series-arm resonator S4 located at the last stage in the four-stage structure is smaller than the average value of the static capacitances of the other series-arm resonators S1 through S3 in the ladder-type SAW filter device 1.

Figure 10:
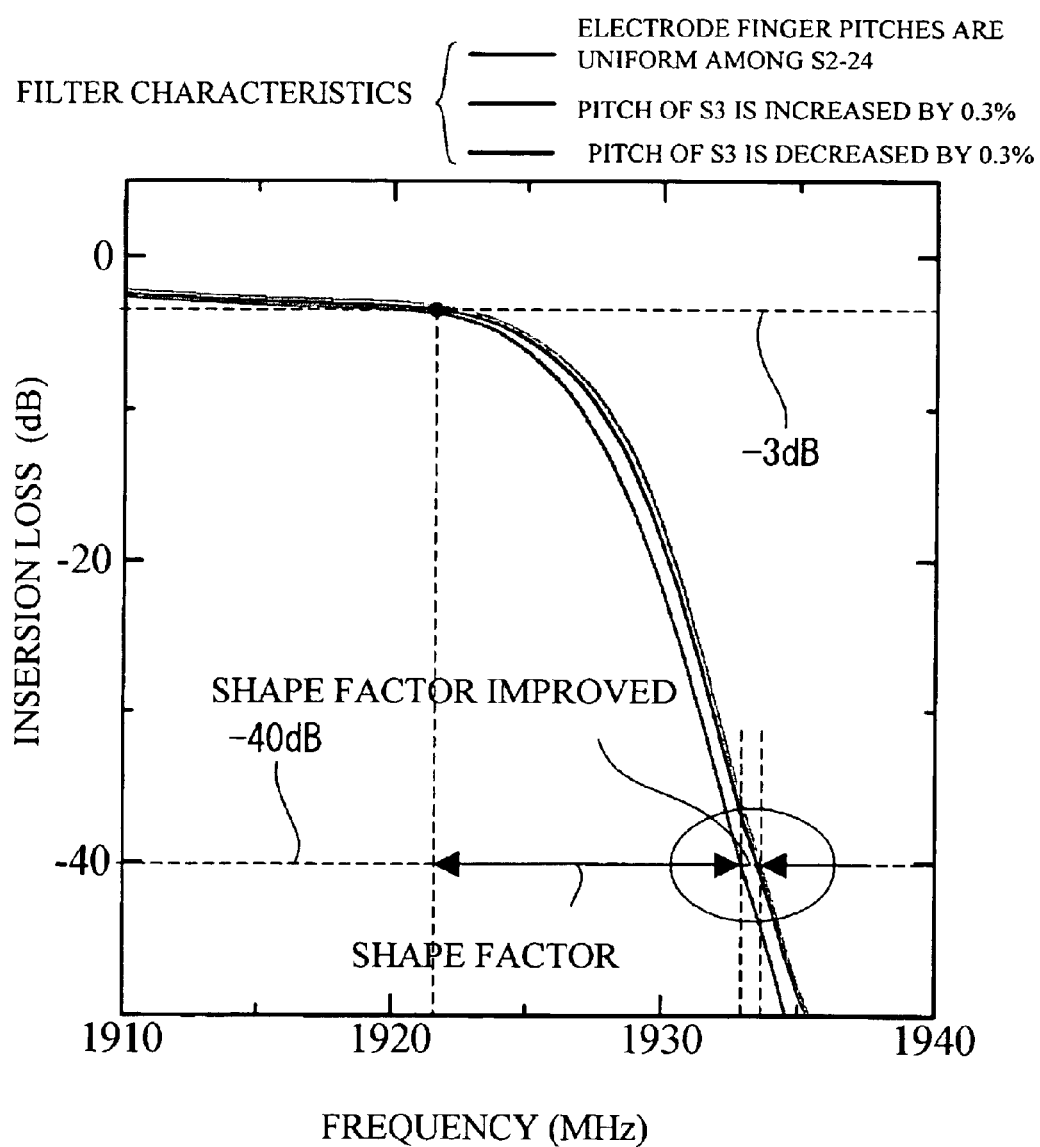
FIG. 10 is a graph showing the admittance characteristics and the filter characteristics that were obtained when the ladder-type SAW filter device of FIG. 2 was produced according to the design parameters shown in Table 1.

FIG. 10 shows the filter characteristics obtained when the electrode finger pitch of the series-arm resonator S3 located at the third stage in the four-stage structure was shortened or elongated by 0.3% (or the resonant frequency of the series-arm resonator S3 was increased or reduced), using the design parameters shown in Table 1. As is apparent from FIG. 10, when each electrode finger pitch of the series-arm resonator S3 was elongated by 0.3%, the transition region between −3 dB and −40 dB in the filter characteristics of the ladder-type SAW filter device 1 became narrower. Accordingly, the shape factor was improved. This is because the "shoulder" K of the curve in the vicinity of −3 dB in the filter characteristics remained substantially the same, while the attenuation pole D shifted to the lower frequency side. When each electrode finger pitch of the series-arm resonator S3 was shortened by 0.3%, on the other hand, the shape factor of the filter characteristics remained substantially the same.

As described above, the shape factor of the filter characteristic can be improved by setting each electrode finger pitch of the series-arm resonator S3 of the third stage longer than the electrode finger pitches of the other series-arm resonators in the case that the static capacitance of the series-arm resonator S4 of the last stage is smaller than those of the other series-arm resonators S1 through S3 in the ladder-type SAW filter device 1 having a four-stage structure of this embodiment.

In the ladder-type SAW filter device 1 shown in FIG. 2, the shape factor of the filter characteristics can be further increased by the IDT 11 of at least one of the series-arm resonators in the ladder-type SAW filter device 1 satisfying the following expression (1), the series-arm resonator being Sc:

$$W/L \leq -25(\%) \quad (1)$$

With the expression (1) being satisfied, the leak loss in the transverse direction with respect to the propagation direction in the resonators is reduced. Thus, the shape factor of the filter characteristics can be further increased. In the expression (1), W represents the total width of the electrode fingers in the IDT 11, and L represents the length of the ITD 11 in the SAW propagation direction.

In other words, the filter characteristics of the ladder-type SAW filter device 1 can be further improved by satisfying the following expression (2):

$$wa \leq 25(\%) \quad (2)$$

$$(wa = 2w/pi \times 100(\%))$$

where w represents the width of each one electrode finger in the IDT 11, pi represents each electrode finger pitch, and wa represents the ratio of the total width of two electrode fingers to one pitch pi (the ratio being hereinafter referred to as the "pattern width") in the series-arm resonator Sc.

Figure 11:
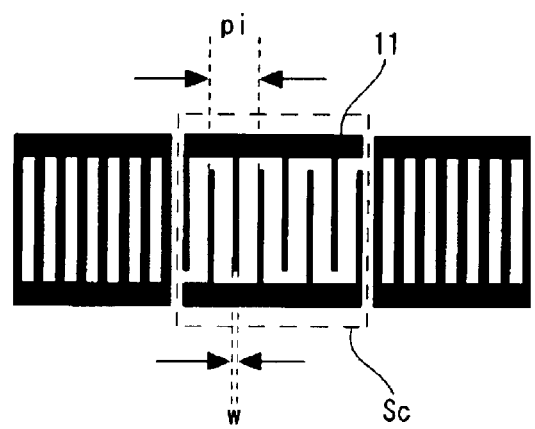
FIG. 11 is a top view of a series-arm resonator that maintains the total width of two electrode fingers of the IDT 11 in the range of 15% to 25% of the electrode finger pitch.

In a case where the pattern width wa is smaller than 15%, however, the electrode finger resistance in the series-arm resonator Sc increases, and accordingly, the insertion loss increases. For this reason, the pattern width wa (or W/L) should preferably be 15% or more. Although the upper limit of the pattern width wa is set at 25% in the expression (2), it is more preferable to set the pattern width wa at 22.5%. The series-arm resonator Sc having such a structure is shown in FIG. 11.

In this manner, the pattern width wa of the IDT 11 of the series-arm resonator Sc is designed to be 15% to 25%, so that the leak loss is reduced in the transverse direction with respect to the propagation direction in the resonator. As a result of this, the shape factor of the filter characteristics is improved. Here, all the electrode fingers in the IDT 11 have the same widths satisfying the condition according to the expression (2), or the total width of the electrode fingers satisfies the condition according to the expression (1). In the latter case, the electrode fingers have irregular widths. It is also possible to combine this structure with the above described structure to further improve the shape factor of the filter characteristics. By doing so, an antenna duplexer can be formed in a system that has a transmission band and a reception band located very close to each other.

In this embodiment, it is also possible to increase the shape factor of the filter characteristics on the high-frequency side by providing dummy electrodes 13 at the electrode non-crossing parts in the IDT of at least one of the series-arm resonators (the at least one series-arm resonator being Sd, and the IDT being 11a). The dummy electrodes 13 do not contribute to excitation of SAW. With the dummy electrodes 13, a SAW guided mode is created, and the excited SAW can be more securely shut in the resonators. In the ITD 11a, each of the electrode finger non-crossing parts should be 1.5 to 4.5 times as long as each one electrode finger pitch. Also, each of the dummy electrodes 13 should be located on the opposite side to the top end of each corresponding electrode finger in the IDT 11a.

Figure 12:
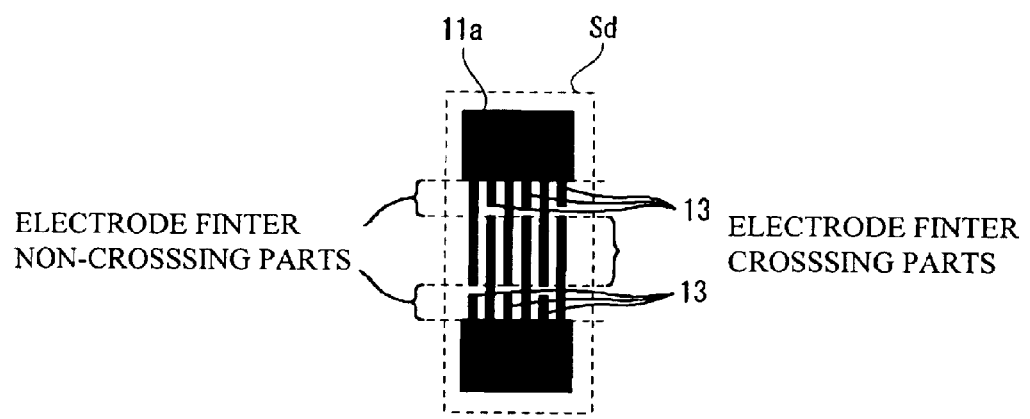
FIG. 12 is a top view of a series-arm resonator that has dummy electrodes in the IDT.

The structure of such a series-arm resonator Sd is shown in FIG. 12. This series-arm resonator Sd having the dummy electrodes 13 may be combined with any of the structures already mentioned, so that the filter characteristics can have an excellent shape factor. With such an excellent shape factor, an antenna duplexer can be formed in a system having a transmission band and a reception band located very close to each other. Also, such an antenna duplexer can be made small, and can be produced at low costs.

The structure of the ladder-type SAW filter device 1 will now be described in greater detail. In the ladder-type SAW filter device 1 shown in FIG. 2, the electrode finger pitches of the series-arm resonators S1, S2, and S4 are all 2.12 μm long, while each electrode finger pitch of the series-arm resonator S3 is 2.13 μm long. The relative static capacitances of the series-arm resonators S2 through S4 are 1, 1, and 0.75, respectively, with the static capacitance of the series-arm resonator S1 being 1. The electrode finger pitches of the parallel-arm resonators P1 and P2 are both 2.16 μm, and the relative static capacitances are both 0.8.

Figure 13:
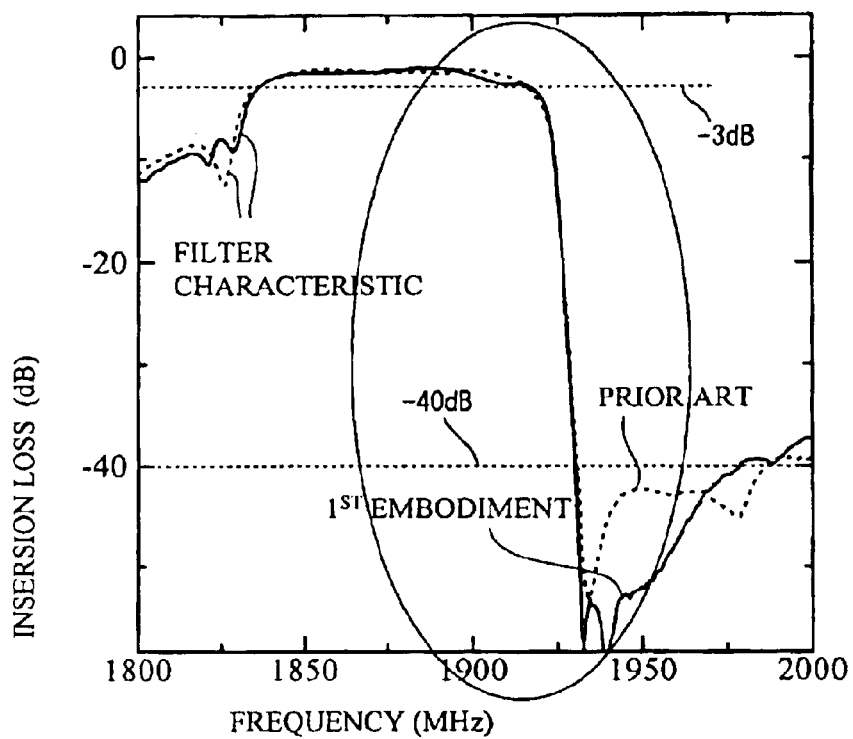
FIGS. 13A and 13B are graphs showing the admittance characteristic and the filter characteristics of a specific example of the ladder-type SAW filter device of FIG. 2.
Figure 13B:
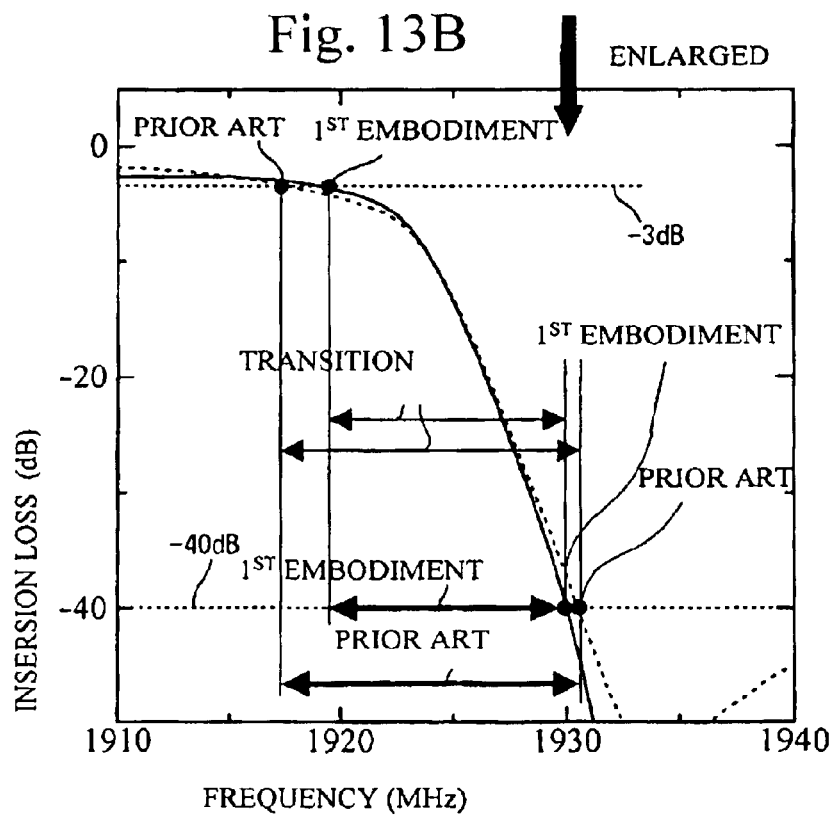

The filter characteristics of the ladder-type SAW filter device 1 having such a structure are shown in FIGS. 13A and 13B. For the sake of comparison, the filter characteristics obtained when the electrode finger pitches of the series-arm resonators S1 through S4 were all 2.12 μm are shown by the broken lines as conventional examples in FIGS. 13A and 13B. FIG. 13B is a graph showing an enlarged version of the notable region in FIG. 13A. As is apparent from FIGS. 13A and 13B, the frequency difference Δf between the point of 3 dB on the high-frequency side in the pass band and the point of −40 dB was reduced by elongating each electrode finger pitch of the series-arm resonator S3 among the series-arm resonators S1 through S4. Thus, the shape factor of the filter characteristics was improved.

(Second Embodiment)

Figure 14:
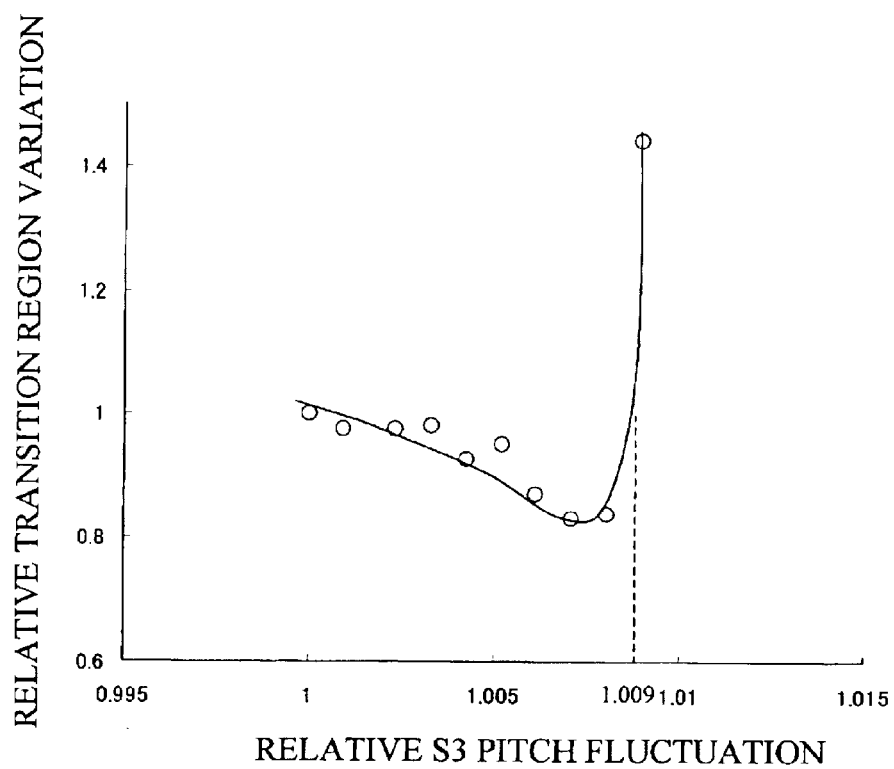
FIG. 14 is a graph showing a relative fluctuation of the frequency width of the filter characteristics in the high-frequency side transition region (the frequency width between the point of −3 dB in the pass band and the point of −40 dB) with respect to the variation rate of the electrode finger pitches of one of the series-arm resonators of a ladder-type SAW filter device in accordance with a second embodiment of the present invention.

Referring now to FIG. 14, a second embodiment of the present invention in the form of a ladder-type SAW filter device 2 will be described in detail.

The structure of the ladder-type SAW filter device 2 of this embodiment is substantially the same as the structure shown in FIG. 2. Also, the piezoelectric substrate 10 is a 42° Y-cut X-propagation LiTaO$_3$ substrate that is the same as in the first embodiment.

In this structure, the electrode finger pitches of the series-arm resonators S1, S2, and S4 are all 2.12 μm, while only each electrode finger pitch of the series-arm resonator S3 is changed. With the static capacitance of the series-arm resonator S1 being 1, the relative static capacitances of the series-arm resonators S2 through S4 are 1, 1, and 0.75, respectively. Meanwhile, the electrode finger pitches of the parallel-arm resonators P1 and P2 are both 2.16 μm, and the relative static capacitances are 0.8.

FIG. 14 shows a relative fluctuation of the frequency width of the filter characteristics in the high-frequency side transition region (the frequency width between the point of −3 dB in the pass band and the point of −40 dB) with respect to the variation rate of each electrode finger pitch of the series-arm resonator S3 in the ladder-type SAW filter device 2 having the above structure. The shape factor on the high-frequency side can be improved by elongating each electrode finger pitch of the series-arm resonator S3 by a length in the range of 0% to 1% of the average length of the electrode finger pitches of the series-arm resonators S2 through S4. The other aspects of this embodiment are the same as the corresponding aspects of the first embodiment, and therefore, explanation of them is omitted herein.

(Third Embodiment)

Figure 15:
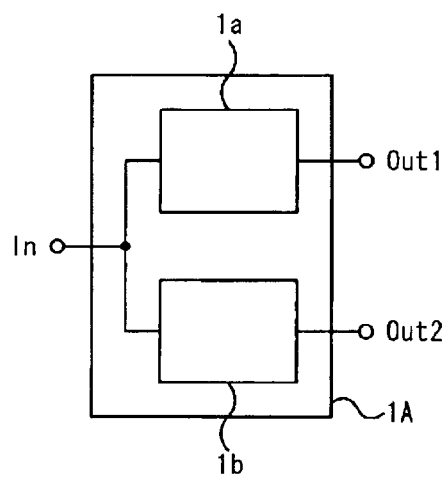
FIG. 15 is a block diagram illustrating the structure of an antenna duplexer in accordance with a third embodiment of the present invention.
Figure 16:
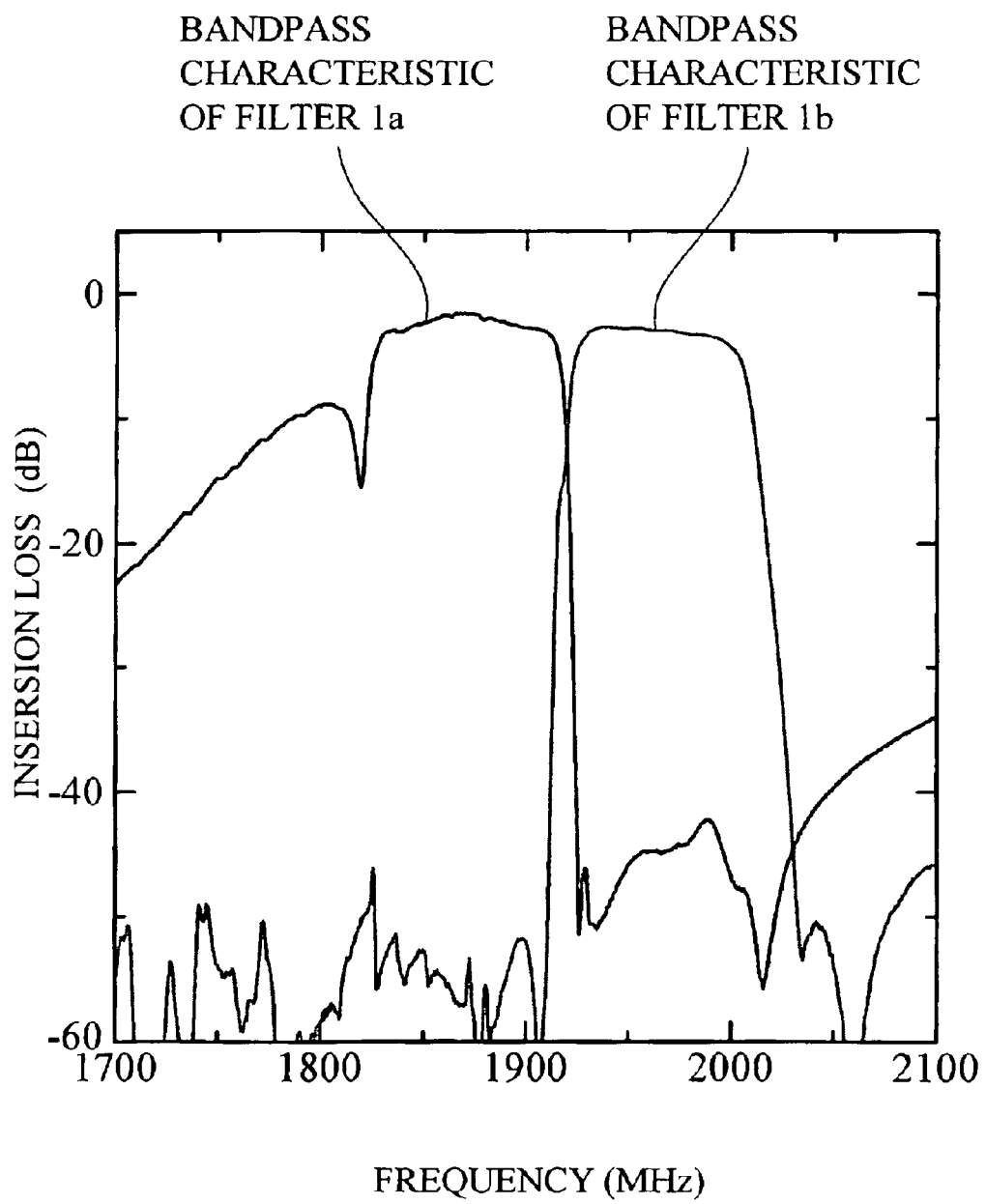
FIG. 16 is a graph showing the filter characteristics of the low-frequency filter and the high-frequency filter of the antenna duplexer shown in FIG. 15.

Referring now to FIGS. 15 and 16, a third embodiment of the present invention will be described in detail. In this embodiment, the ladder-type SAW filter device 1 of the first embodiment is used as a filter 1a on a comparatively low-frequency side, and a longitudinally coupled SAW resonator filter is used as a filter 1b on a comparatively high-frequency side. These filters are mounted in one package to form a 1.9 GHz band antenna duplexer 1A. FIG. 15 illustrates this antenna duplexer 1A in accordance with this embodiment.

The filter characteristics of this antenna duplexer 1A are shown in FIG. 16. As is apparent from FIG. 16, the shape factor on the high-frequency side of the filter 1a on the low-frequency side is excellent. Accordingly, the antenna duplexer 1A of this embodiment has an attenuation rate maintained at −40 dB or higher in the reception band, despite the fact that the frequency gap between the transmission band and the reception band is only 20 MHz. Thus, a small-size, inexpensive antenna duplexer can be realized with the ladder-type SAW filter device 1 of the first embodiment. The other aspects of the structure of this embodiment are the same as the corresponding aspects of the first embodiment, and therefore, explanation of them are omitted herein. This embodiment can also be applied to an antenna duplexer using the ladder-type SAW filter device 2 of the second embodiment.

Although a few preferred embodiments of the present invention have been shown and described, it would be appreciated by those skilled in the art that changes may be made in these embodiments without departing from the principles and spirit of the invention, the scope of which is defined in the claims and their equivalents.

The present invention is based on Japanese patent application no. 2002-284867 filed on Sep. 30, 2002, the entire disclosure of which is hereby incorporated by reference.

What is claimed is:

1. A surface acoustic wave duplexer comprising two filters having different pass bands,
   one of the two filters located on a lower frequency side comprising a surface acoustic wave filter that includes series-arm resonators and parallel-arm resonators that are connected in a ladder-like structure, each having an interdigital transducer formed on a piezoelectric substrate, and the series-arm resonator located at the last stage having a smaller static capacitance than the other series-arm resonators,
   wherein at least one of the series-arm resonators except the series-arm resonator located at the first stage in the ladder-like structure has an interdigital transducer with a longer electrode finger pitch than the average of electrode finger pitches of the interdigital transducers of the other series-arm resonators.

2. A surface acoustic wave duplexer comprising two filters having different pass bands,
   one of the two filters located on a lower frequency side comprising a surface acoustic wave filter that includes series-arm resonators and parallel-arm resonators that are connected in a ladder-like structure, each having an interdigital transducer formed on a piezoelectric substrate, and at least one of the series-arm resonators having a different static capacitance from the other series-arm resonators,
   wherein at least one of the series-arm resonators except the series-arm resonators located at the first and last stages in the ladder-like structure has an interdigital transducer with a longer electrode finger pitch than the average of electrode finger pitches of the interdigital transducers of the other series-arm resonators, and has a greater static capacitance than the average of the static capacitances of the other series-arm resonators.

3. A surface acoustic wave duplexer comprising two filters having different pass bands,
   one of the two filters located on a lower frequency side comprising a surface acoustic wave filter that includes series-arm resonators and parallel-arm resonators that are connected in a ladder-like structure, each having an interdigital transducer formed on a piezoelectric substrate, and at least one of the series-arm resonators having a different static capacitance from the other series-arm resonators,
   wherein: at least one of the series-arm resonators except the series-arm resonator located at the first stage in the ladder-like structure has a lower average resonant frequency than the other series-arm resonators;
   the interdigital transducer of at least one of the series-arm resonators has dummy electrodes that are located at electrode finger non-crossing parts and do not contribute to excitation of surface acoustic wave; and
   each of the electrode finger non-crossing parts is 1.5 to 4.5 times as long as the electrode finger pitch of the interdigital transducer.

4. A surface acoustic wave filter comprising:
   series-arm resonators and parallel-arm resonators that are connected in a ladder-like structure, each having an interdigital transducer formed on a piezoelectric substrate, and at least one of the series-arm resonators having a different static capacitance from the other series-arm resonators,
   wherein: at least one of the series-arm resonators except the series-arm resonator located at the first stage in the ladder-like structure has a lower average resonant frequency than the other series-arm resonators;
   the interdigital transducer of at least one of the series-arm resonators has dummy electrodes that are located at electrode finger non-crossing parts and do not contribute to excitation of surface acoustic wave; and
   each of the electrode finger non-crossing parts is 1.5 to 4.5 times as long as the electrode finger pitch of the interdigital transducer.

5. The surface acoustic wave filter as claimed in claim 4, wherein the series-arm resonators each has reflectors located on opposite sides in the propagation direction of surface acoustic wave.

6. The surface acoustic wave filter as claimed in claim 4, wherein the interdigital transducer of each of the series-arm resonators and the parallel-arm resonators has a single electrode structure.

7. The surface acoustic wave filter as claimed in claim 4, wherein the piezoelectric substrate of each of the series-arm resonators and the parallel-arm resonators is made of 42° Y-cut X-propagation $LiTaO_3$.

8. The surface acoustic wave filter as claimed in claim 4, wherein at least one of the series-arm resonators has an interdigital transducer with electrode finger widths that are in the range of 15% to 22.5% of an electrode finger pitch.

9. The surface acoustic wave filter as claimed in claim 8, wherein the interdigital transducer with the electrode finger widths in the range of to 22.5% of the electrode finger pitch has electrode fingers of uniform widths.

10. The surface acoustic wave filter as claimed in claim 8, wherein the interdigital transducer with the electrode finger widths in the range of 15% to 22.5% of the electrode finger pitch has electrode fingers of irregular widths.

11. A surface acoustic wave filter comprising series-arm resonators and parallel-arm resonators that are connected in a ladder-like structure, each having an interdigital transducer formed on a piezoelectric substrate, and at least one of the series-arm resonators having a different static capacitance from the other series-arm resonators,
    wherein at least one of the series-arm resonators except the series-arm resonators located at the first and last stages in the ladder-like structure has an interdigital transducer with a longer electrode finger pitch than the average of electrode finger pitches of the interdigital transducers of the other series-arm resonators, and has a greater static capacitance than the average of the static capacitances of the other series-arm resonators.

12. The surface acoustic wave filter as claimed in claim 11, wherein the interdigital transducer of at least one of the series-arm resonators has dummy electrodes that are located at electrode finger non-crossing parts and do not contribute to excitation of surface acoustic wave.

13. The surface acoustic wave filter as claimed in claim 12, wherein each of the dummy electrodes faces a top end of each corresponding electrode finger of the interdigital transducer.

14. The surface acoustic wave filter as claimed in claim 12, wherein each of the electrode finger non-crossing parts is 1.5 to 4.5 times as long as the electrode finger pitch of the interdigital transducer.

15. The surface acoustic wave filter as claimed in claim 11, wherein at least one of the series-arm resonators has an interdigital transducer with electrode finger widths that are in the range of 15% to 22.5% of an electrode finger pitch.

16. The surface acoustic wave filter as claimed in claim 11, wherein the interdigital transducer of at least one of the series-arm resonators has dummy electrodes that are located at electrode finger non-crossing parts and do not contribute to excitation of surface acoustic wave.

17. A surface acoustic wave filter comprising:
series-arm resonators and parallel-arm resonators that are connected in a ladder-like structure, each having an interdigital transducer formed on a piezoelectric substrate, and at least one of the series-arm resonators having a different static capacitance from the other series-arm resonators,
wherein at least one of the series-arm resonators except the series-arm resonator located at the first stage in the ladder-like structure has a lower average resonant frequency than the other series-arm resonators;
each of the electrode finger non-crossing parts is 1.5 to 4.5 times as long as the electrode finger pitch of the interdigital transducer; and
at least one of the series-arm resonators has an interdigital transducer with electrode finger widths that are in the range of 15% to 22.5% of an electrode finger pitch.

18. A surface acoustic wave filter comprising series-arm resonators and parallel-arm resonators that are connected in a ladder-like structure, each having an interdigital transducer formed on a piezoelectric substrate, and the series-arm resonator located at the last stage having a smaller static capacitance than the other series-arm resonators,
wherein at least one of the series-arm resonators except the series-arm resonator located at the first stage in the ladder-like structure has an interdigital transducer with a longer electrode finger pitch than the average of electrode finger pitches of the interdigital transducers of the other series-arm resonators.

19. The surface acoustic wave filter as claimed in claim 18, wherein at least one of the series-arm resonators has an interdigital transducer with electrode finger widths that are in the range of 15% to 22.5% of an electrode finger pitch.

20. The surface acoustic wave filter as claimed in claim 18, wherein the series-arm resonator having the interdigital transducer with the electrode finger pitch longer than the average has a greater static capacitance than the average of the static capacitances of the other series-arm resonators.

21. The surface acoustic wave filter as claimed in claim 18, wherein the interdigital transducer of at least one of the series-arm resonators has dummy electrodes that are located at electrode finger non-crossing parts and do not contribute to excitation of surface acoustic wave.

22. The surface acoustic wave filter as claimed in claim 18, wherein:
the ladder-like structure includes four stages; and
the series-arm resonator located at the third stage in the ladder-like structure has an interdigital transducer with a longer electrode finger pitch than the average of the electrode finger pitches of the interdigital transducers of the series-arm resonators located at the second and fourth stages in the ladder-like structure.

23. The surface acoustic wave filter as claimed in claim 22, wherein the static capacitance of the series-arm resonator located at the third stage in the ladder-like structure is greater than the average of the static capacitances of the series-arm resonators located at the first and second stages in the ladder-like structure.

24. The surface acoustic wave filter as claimed in claim 22, wherein each of the electrode finger pitches of the interdigital transducer in the series-arm resonator located at the third stage in the ladder-like structure is longer than the average of the electrode finger pitches of the interdigital transducers of the series-arm resonators located at the second and fourth stages in the ladder-like structure, by 1% or less.

* * * * *